United States Patent
Gurary et al.

[11] Patent Number: 6,001,183
[45] Date of Patent: Dec. 14, 1999

[54] WAFER CARRIERS FOR EPITAXIAL GROWTH PROCESSES

[75] Inventors: Alexander I. Gurary, Bridgewater; Eric A. Armour, Franklin Park; Douglas A. Collins, North Brunswick; Richard A. Stall, Belle Mead, all of N.J.

[73] Assignee: Emcore Corporation, Somerset, N.J.

[21] Appl. No.: 08/723,682

[22] Filed: Sep. 30, 1996

Related U.S. Application Data

[60] Provisional application No. 60/019,444, Jun. 10, 1996.

[51] Int. Cl.⁶ .................................................. C23C 16/00
[52] U.S. Cl. .......................................... 118/720; 118/730
[58] Field of Search ................... 118/500, 715, 118/725, 728; 156/345

[56] References Cited

U.S. PATENT DOCUMENTS

| | | | |
|---|---|---|---|
| 4,599,069 | 7/1986 | Murakami et al. | 432/253 |
| 4,903,754 | 2/1990 | Hirscher et al. | 165/1 |
| 4,986,215 | 1/1991 | Yamada et al. | 118/728 |
| 5,044,943 | 9/1991 | Bowman et al. | 432/121 |
| 5,152,842 | 10/1992 | Urata et al. | 118/725 |
| 5,226,383 | 7/1993 | Bhat | 118/730 |
| 5,242,501 | 9/1993 | McDiarmid | 118/728 |
| 5,343,938 | 9/1994 | Schmidt | 165/80.2 |
| 5,344,492 | 9/1994 | Sato et al. | 118/725 |
| 5,366,002 | 11/1994 | Tepman | 165/1 |
| 5,376,180 | 12/1994 | Mahler | 118/728 |
| 5,384,008 | 1/1995 | Sinha et al. | 156/643 |
| 5,403,401 | 4/1995 | Haafkens et al. | 118/728 |
| 5,460,684 | 10/1995 | Saeki et al. | 156/345 |
| 5,474,612 | 12/1995 | Sato et al. | 118/725 |
| 5,690,742 | 11/1997 | Ogata et al. | 118/500 |
| 5,782,970 | 7/1998 | Kaneno et al. | 118/500 |

*Primary Examiner*—Bruce Breneman
*Assistant Examiner*—Allan Olsen
*Attorney, Agent, or Firm*—Lerner, David, Littenberg, Krumholz & Mentlik, LLP

[57] ABSTRACT

A wafer carrier/susceptor combination for use in an epitaxial deposition process has a configuration which provides greater thermal conductivity between the susceptor and the wafer carrier in regions substantially underlying the wafers than in regions not underlying the wafers. This difference in thermal conductivity is produced by configuring the wafer carrier or susceptor so that the lower surface of the wafer carrier is disposed closer to the susceptor in regions substantially underlying the wafers than in at least some regions not underlying the wafers. By controlling the thermal conductivity so that it is greater in certain regions than in other regions, the temperature difference between the wafers and the surface of the wafer carrier can be reduced, and a more uniform temperature distribution across the surface of the wafer can be achieved. As a result, the combination may be used to deposit a more uniform coating across the entire surface of each wafer.

25 Claims, 8 Drawing Sheets

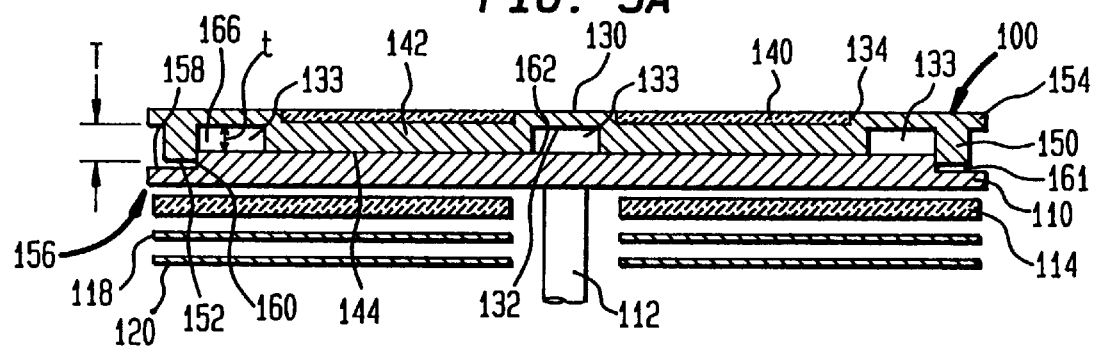
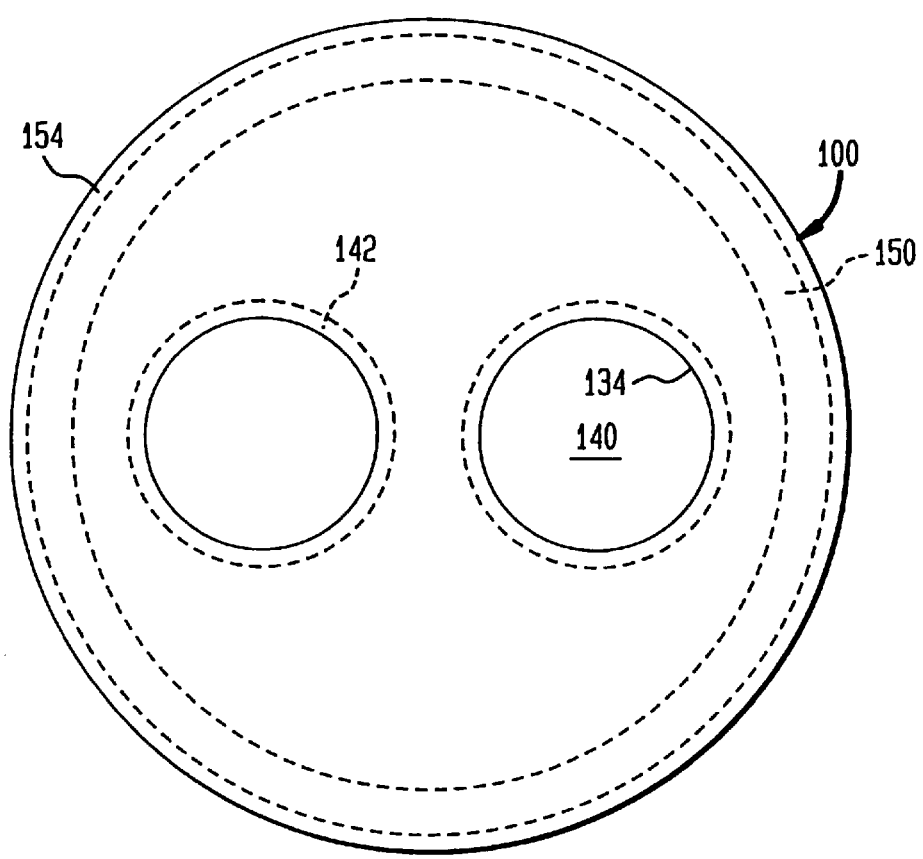

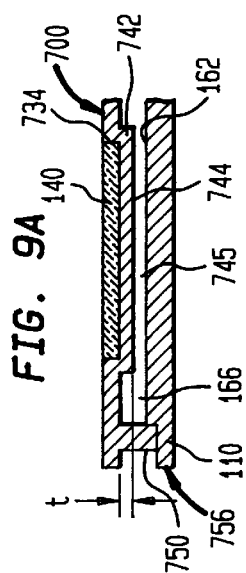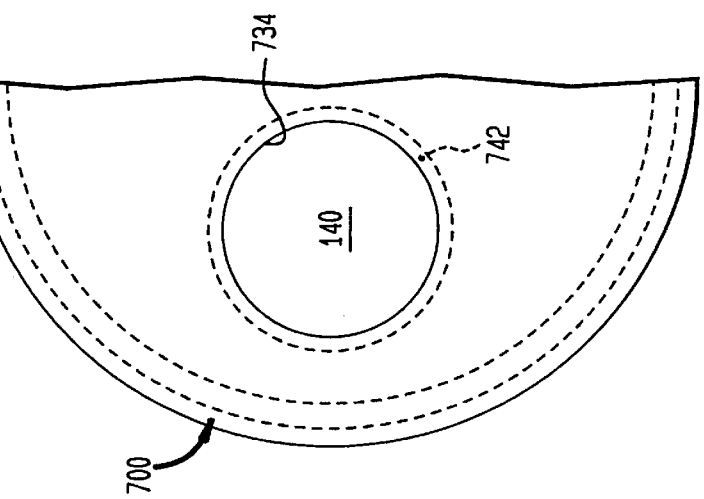
FIG. 9A
FIG. 9B
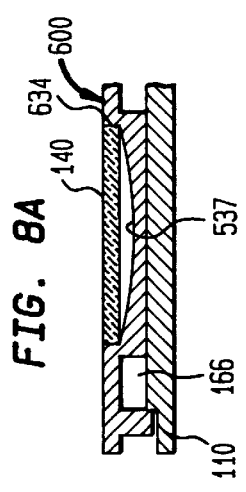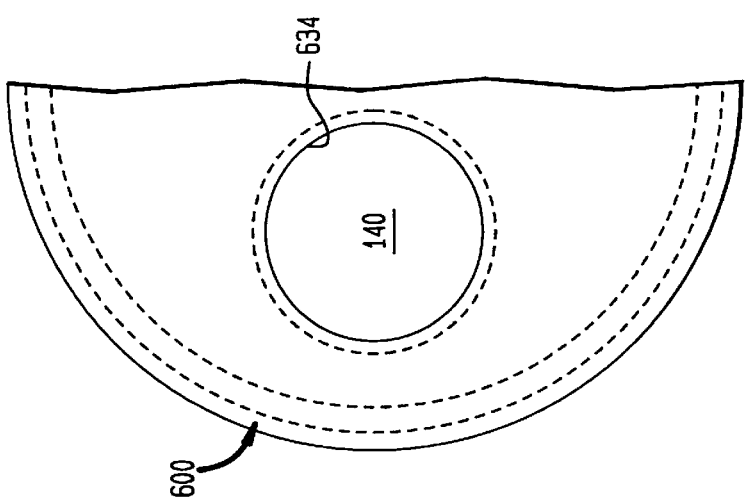
FIG. 8A
FIG. 8B
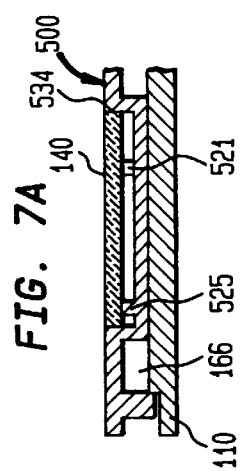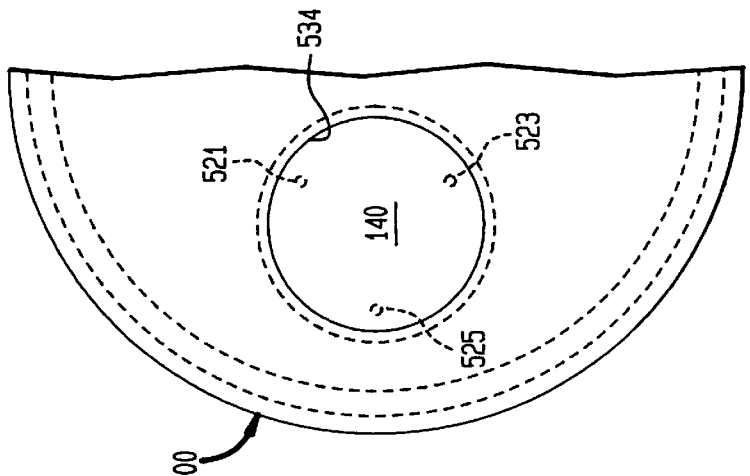
FIG. 7A
FIG. 7B

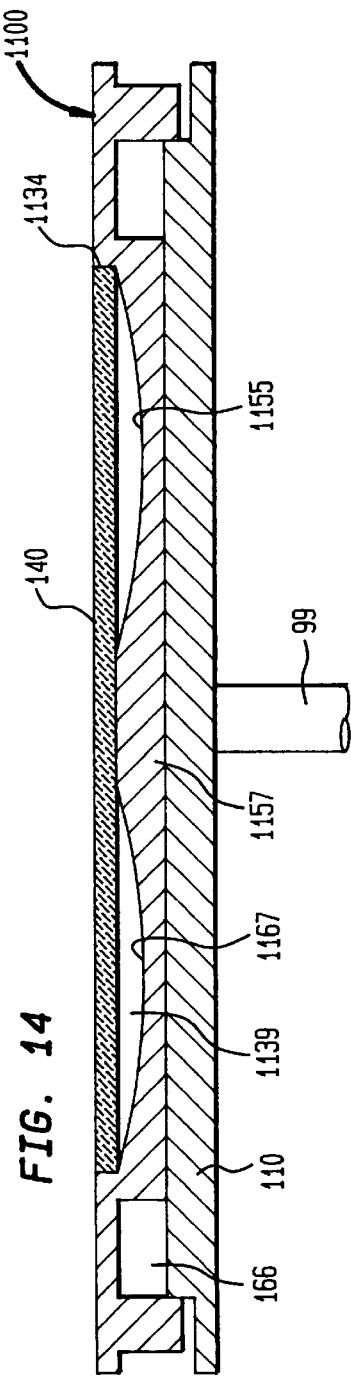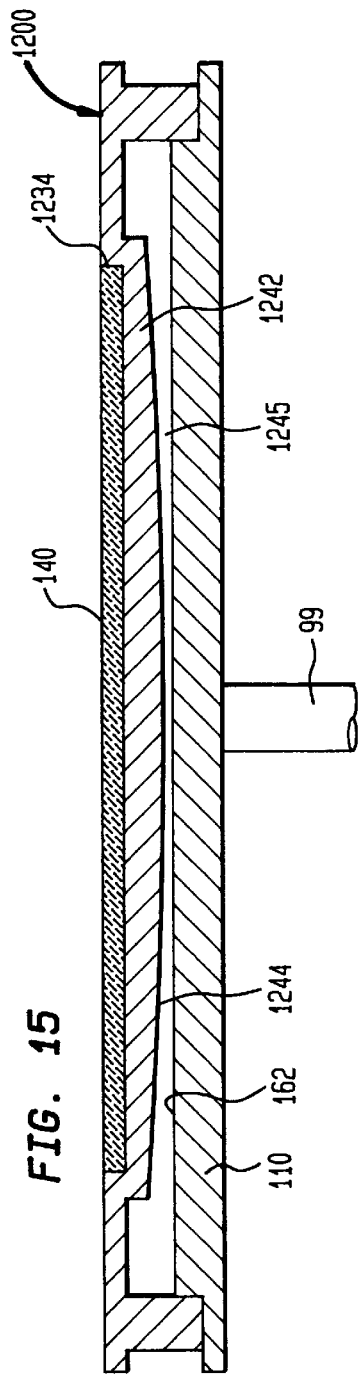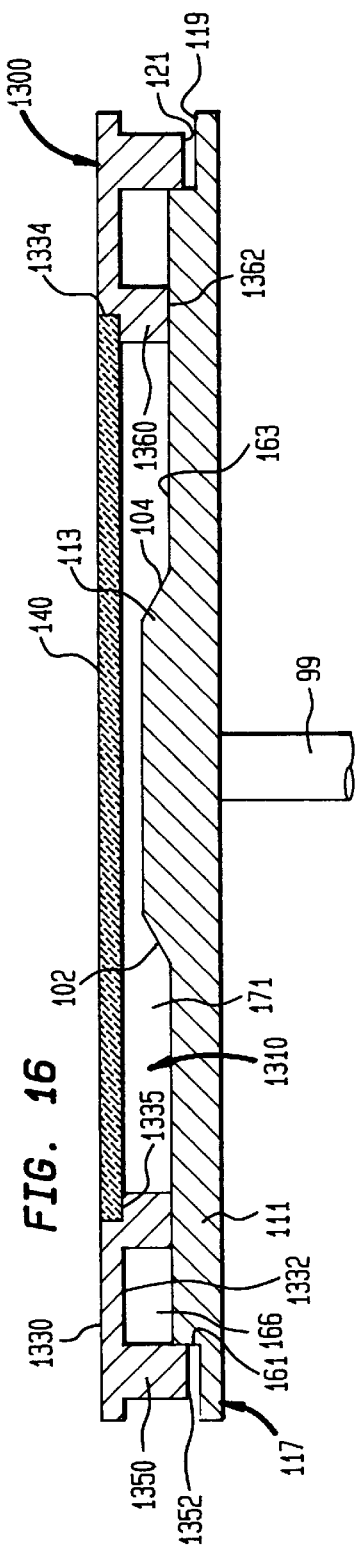

WAFER CARRIERS FOR EPITAXIAL GROWTH PROCESSES

This application claims benefit of Provisional Application No. 60/019,444, filed Jun. 10, 1996.

FIELD OF THE INVENTION

The present invention relates to apparatus and methods for depositing a coating on a substrate, and more particularly to the wafer carriers used in such processes. Still more particularly, the present invention is directed to wafer carriers which enable highly dimensionally and structurally uniform epitaxial layers to be deposited on wafer substrates during the preparation of semiconductor devices.

BACKGROUND OF THE INVENTION

Although various industries are extant which employ processes for forming a thin layer or film on a solid substrate, one significant industry in which such processes are widely employed is the production of semiconductor devices. In such production processes, heated substrates, such as planar silicon or gallium arsenide wafers or other suitable such materials, are exposed to gases which react to deposit the desired materials on the surface of the wafer. In typical processes of this nature, the deposited materials form epitaxial films which replicate the crystal lattice structure of the underlying wafer.

These coated wafers are then subjected to well known further processes to form semiconductor devices such as lasers, transistors, etc. For example, in the production of integrated circuits, the layers deposited on the wafer form the active elements of microscopic transistors and other semiconductor devices included in the integrated circuit. The thickness, composition and quality of the deposited layers determine the characteristics of the resulting semiconductor devices. Accordingly, the deposition process must be capable of depositing films of uniform composition and thickness on the front face of each wafer. The requirements for uniformity have become progressively more stringent with the use of larger wafers and with the use of apparatus which deposits coatings on several wafers simultaneously.

In a typical prior art deposition apparatus illustrated in FIG. 1, a wafer 10 is mounted in a wafer carrier 12 which, in turn, is mounted on a susceptor 14. The susceptor 14 may be mounted in a rotating support spindle 16. The susceptor 14, the wafer carrier 12 and the wafer 10 typically are located in an enclosed process reactor 18. A heating assembly 20 symmetrically arranged below susceptor 14 heats the susceptor, which thus results in the heating of wafer carrier 12 and wafer 10 mounted thereon. The use of rotating spindle 16 is intended to enhance the temperature uniformity across the deposition area, as well as the uniformity of the source material gases or vapors flowing over the deposition area.

Conventional wafer carriers, such as wafer carrier 12 shown in FIG. 2, include multiple cylindrical pockets 22 on their upper surface for holding the wafers in place as the wafer carrier is rotated during the deposition process. Typically, the pockets have a diameter which is about 0.020 inches bigger than the diameter of the wafer and a depth which is about 0.002 inches deeper than the thickness of the wafer. These wafer carriers ordinarily also include an annular flange 24 which is used for lifting and transporting the wafer carrier into and out from the reaction chamber. On their bottom surface, the wafer carriers may include an annular wall 26 for locating and holding the wafer carrier concentrically on the susceptor as the assembly is rotated during the deposition process, and for creating a gap 28 between the upper surface of the susceptor and the lower surface of the wafer carrier, which gap eliminates localized heating of the wafer carrier resulting from points of contact between the wafer carrier and the susceptor, and thus enhances the uniform transfer of heat from the susceptor to the wafer carrier.

In deposition processes using conventional wafer carriers, the surface temperature of the wafers is usually cooler than the surface temperature of the wafer carrier as a result of the thermal resistance created by the interface between the wafers and the wafer carrier and the different emissivities of the materials from which the wafer carrier and the wafer are made. Having the surface of the wafer cooler than the surface of the wafer carrier causes drawbacks which diminish the quality of the resultant semiconductor devices. Firstly, during the deposition process, source materials are deposited not only on the exposed surface of the wafers, but also on the exposed surface of the wafer carrier. During subsequent deposition cycles, the higher temperature of the wafer carrier surface can cause the deposited materials to be reevaporated from the wafer carrier surface, resulting in contamination of the materials being deposited on the wafers. Furthermore, the higher temperature of the wafer carrier surface results in a nonuniform temperature on the surface of the wafers, particularly along their outer periphery, such that the layer deposited along this portion of the wafers ordinarily is of poor quality and must be discarded.

There therefore exists a need for a system which will achieve a smaller difference in temperature between the wafers and the wafer carrier surface, as well as a more uniform temperature distribution across the surface of the wafers, such that a more uniform coating can be deposited across the entire surface of each wafer. More particularly, there exists the need for a wafer carrier which will promote the uniform heating of the wafers carried thereon.

SUMMARY OF THE INVENTION

The present invention addresses these needs by providing apparatus for supporting a substrate in a coating deposition chamber.

One embodiment of the apparatus includes a substrate holder having an upper surface and a lower surface, the upper surface defining a cavity for receiving a substrate. The lower surface is disposed at a relatively low elevation in regions substantially underlying the cavity and at a higher elevation in at least some regions not underlying the cavity. The lower surface may include a substantially cylindrical member in the regions substantially underlying the cavity, the substantially cylindrical member preferably having a diameter of between about 0.8–1.2 times the diameter of the cavity, and more preferably a diameter which is about equal to the diameter of the cavity.

In a variant of this embodiment, the cavity may include a bottom surface and support means for supporting the substrate at a spaced distance from the bottom surface so as to minimize localized hot spots in the wafer. The bottom surface may be curved in an upwardly concave direction, or may include an annular groove formed along the periphery of the cavity. In preferred embodiments, the support means may take the form of an annular shoulder, or at least three spaced elements projecting upwardly from the bottom surface for supporting the substrate by three point loading.

In another variant of this embodiment intended to minimize a temperature gradient between two regions of the wafer, the lower surface of the wafer carrier may include a substantially cylindrical mass of material in the regions substantially underlying the cavity, with a void space disposed in the mass of material asymmetrically with respect to an axis of the mass.

In preferred variants of this embodiment, the upper surface of the wafer carrier defines a plurality of cavities for holding a plurality of wafers simultaneously. In these variants, the lower surface may be disposed at a relatively low elevation in those regions substantially underlying each one of the plurality of cavities and at a higher elevation in at least some regions not underlying any one of the plurality of cavities.

Another embodiment of the apparatus of the present invention includes a heated body having an upper surface and a substrate holder mounted on the upper surface of the heated body in an assembled position. The substrate holder has an upper surface and a lower surface, the upper surface defining a cavity for receiving a substrate. The lower surface in the assembled position is disposed closer to the heated body in regions substantially underlying the cavity than in at least some regions not underlying the cavity. In preferred embodiments, the lower surface may include a substantially cylindrical member in the regions substantially underlying the cavity. This substantially cylindrical member preferably as a diameter of between about 0.8–1.2 times the diameter of the cavity, and more preferably a diameter which is about equal to the diameter of the cavity.

In one variant hereof, the lower surface of the substrate holder in the regions substantially underlying the cavity contacts the upper surface of the heated body when in the assembled position. In another variant, the lower surface of the substrate holder in the regions substantially underlying the cavity is spaced from the upper surface of the heated body when in the assembled position. In this latter variant, the lower surface may be spaced a first distance from the upper surface of the heated body in a central portion of the regions substantially underlying the cavity, and the lower surface may be spaced a second distance from the upper surface of the heated body greater than the first distance in peripheral portions of the regions substantially underlying the cavity.

In preferred variants of this embodiment, the upper surface may define a plurality of cavities. In these variants, the lower surface in the assembled position may be disposed closer to the heated body in those regions substantially underlying each one of the plurality of cavities than in at least some regions not underlying any one of the plurality of cavities.

Yet another embodiment of the apparatus of the present invention includes a heated body, holder means for supporting a substrate so that the substrate overlies a portion of the heated body, and means for providing greater thermal conductivity between the heated body and the holder means in regions substantially underlying the substrate than in regions not underlying the substrate. Preferably, the holder means includes an upper surface and a lower surface, the upper surface defining a cavity having a diameter for receiving the substrate, and the lower surface including a substantially cylindrical member in regions substantially underlying the cavity. The substantially cylindrical member preferably has a diameter of between about 0.8–1.2 times the diameter of the cavity, and more preferably a diameter which is about equal to the diameter of the cavity.

In highly preferred embodiments hereof, the means for providing greater thermal conductivity includes the lower surface of the holder means being disposed closer to the heated body in the regions substantially underlying the substrate than in the regions not underlying the substrate. This may be accomplished by having the holder means have a greater mass of solid material in the regions substantially underlying the substrate than in the regions not underlying the substrate. Alternatively, the lower surface of the holder means may be disposed closer to the heated body in the regions substantially underlying the substrate than in the regions not underlying the substrate. In yet another variant, the holder means may include a predetermined mass of material in the regions substantially underlying the substrate, the mass of material having a greater thickness in areas underlying the center of the substrate than in areas not underlying the center of the substrate.

BRIEF DESCRIPTION OF THE DRAWINGS

A more complete appreciation of the subject matter of the present invention and the various advantages thereof can be realized by reference to the following detailed description, in which reference is made to the accompanying drawings in which:

FIG. 3A is a highly schematic front cross-sectional view of a wafer carrier of the present invention for use with a plurality of wafers, showing wafers mounted therein, the susceptor on which the wafer carrier is mounted, the support spindle used to support the susceptor and a heating arrangement for heating the susceptor;

FIG. 3B is a top plan view of the wafer carrier shown in FIG. 3A;

FIG. 7A is a highly schematic partial front cross-sectional view of a fifth embodiment of a wafer carrier of the present invention positioned on a susceptor and showing a wafer mounted therein;

FIG. 7B is a partial top plan view of the wafer carrier shown in FIG. 7A;

FIG. 8A is a highly schematic partial front cross-sectional view of a sixth embodiment of a wafer carrier of the present invention positioned on a susceptor and showing a wafer mounted therein;

FIG. 8B is a partial top plan view of the wafer carrier shown in FIG. 8A;

FIG. 9A is a highly schematic partial front cross-sectional view of a seventh embodiment of a wafer carrier of the present invention positioned on a susceptor and showing a wafer mounted therein;

FIG. 9B is a partial top plan view of the wafer carrier shown in FIG. 9A;

FIG. 14 is a highly schematic front cross-sectional view of a twelfth embodiment of the wafer carrier of the present invention, showing a wafer mounted therein and the susceptor on which the wafer carrier is mounted;

FIG. 15 is a highly schematic front cross-sectional view of a thirteenth embodiment of the wafer carrier of the present invention, showing a wafer mounted therein and the susceptor on which the wafer carrier is mounted;

FIG. 16 is a highly schematic front cross-sectional view of a fourteenth embodiment of the wafer carrier of the present invention, showing a wafer mounted therein and the susceptor on which the wafer carrier is mounted.

DETAILED DESCRIPTION OF THE PREFERRED EMBODIMENTS

Figure 1:
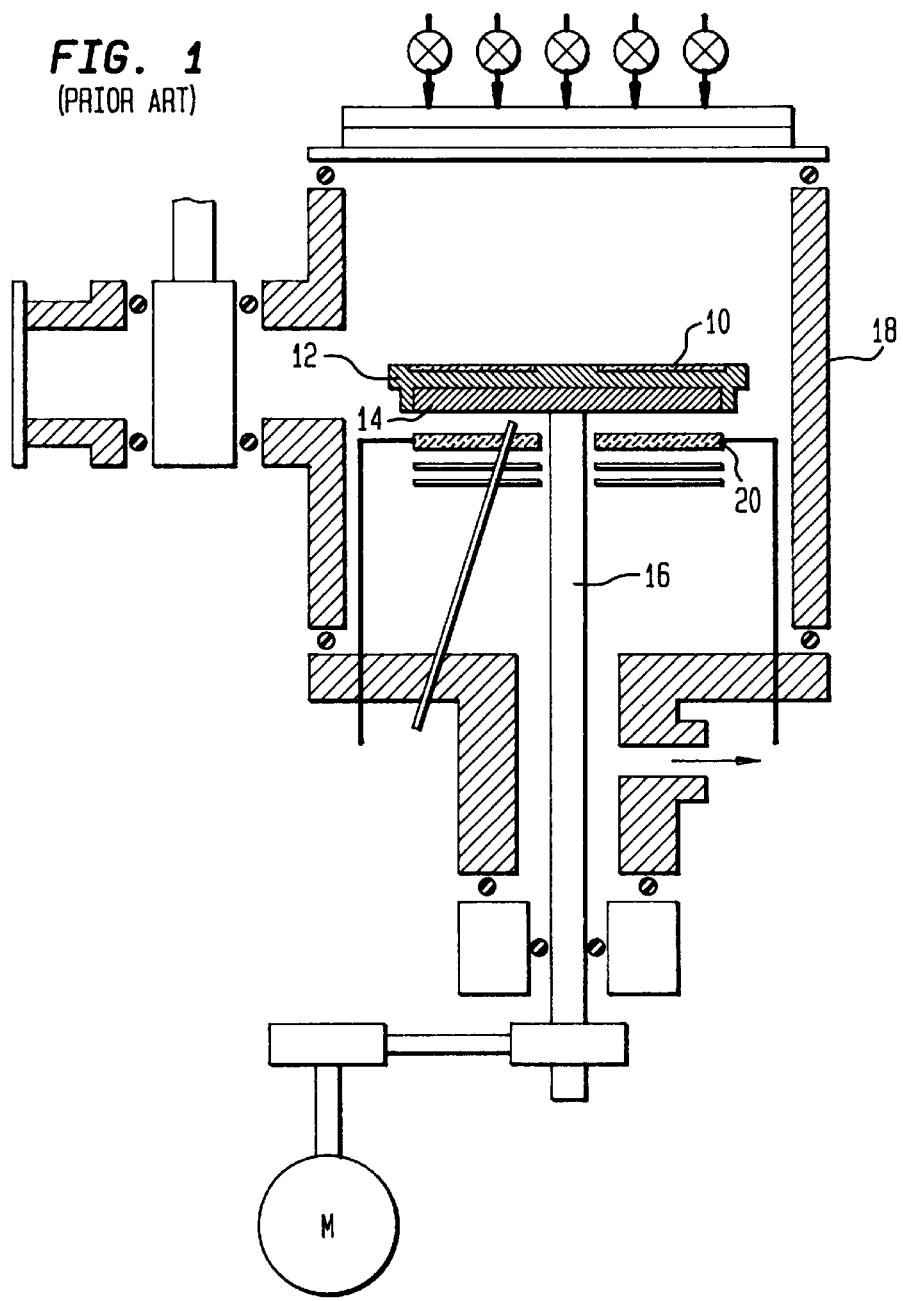
FIG. 1 is a highly schematic front cross-sectional view of a coating apparatus of the prior art.
Figure 2:
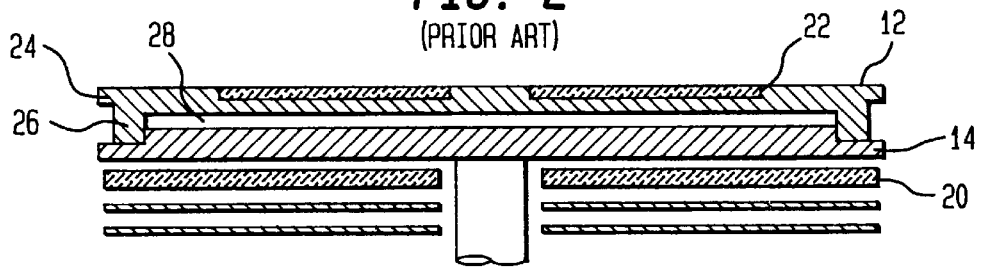
FIG. 2 is a highly schematic front cross-sectional view of a wafer carrier of the prior art showing wafers mounted therein, a susceptor, a support spindle used to support the susceptor and a conventional heating arrangement for heating the susceptor.

One preferred embodiment of a wafer carrier 100 in accordance with the present invention for simultaneously processing a plurality of wafers is shown in FIGS. 3A and B. As illustrated, wafer carrier 100 is positioned in assembled relationship on a susceptor 110, which, in turn, is mounted for rotation on a spindle 112. A conventional resistance heating element 114 may be positioned below susceptor 110 and connected to a power source (not shown). Heat shields 118 and 120 may be mounted below heating element 114 to localize the effect of heating element 114, particularly towards susceptor 110 and wafer carrier 100.

Wafer carrier 100 may be formed from a stable refractory material, such as, for example, molybdenum, graphite or silcon carbide-coated graphite, in the form of a generally disc-shaped body having an upper surface 130 and a lower surface 132. Upper surface 130 extends generally in a plane and includes a plurality of cylindrical cavities or pockets 134, each of which is sized to receive a substrate wafer 140. Although only two such pockets 134 are shown in FIGS. 3A and B, wafer carrier 100 may include any number of such pockets up to forty or more. Lower surface 132 extends generally parallel to upper surface 130 such that wafer carrier 100 has a substantially uniform thickness in those regions 133 which do not substantially underlie pockets 134. However, in the regions substantially underlying each pocket 134, and generally concentric therewith, lower surface 132 projects away from upper surface 130 to define in each such region an integral cylindrically-shaped depending member 142 having a bottom surface 144. For conventional applications of wafer carrier 100, each depending member 142 preferably has a thickness t between bottom surface 144 and lower surface 132 in regions 133 of between about 0.10 inches and about 0.15 inches. In addition, each depending member 142 preferably has a diameter of between about 0.8–1.2 times the diameter of its overlying pocket 134, and most preferably a diameter which is about equal to the diameter of its overlying pocket 134.

Wafer carrier 100 also may include an annular ring 150 projecting away from upper surface 130 and terminating in a free end 152, such that annular ring 150 has a thickness T between free end 152 and lower surface 132 in regions 133. Desirably, annular ring 150 is spaced from the outer periphery of upper surface 130 so as to define an annular flange 154 coextensive with upper surface 130 for lifting and transporting wafer carrier 100 into and out of a reaction chamber. Annular ring 150 is used to locate wafer carrier 100 with respect to susceptor 110 and to hold it in assembled relationship therewith. Along its periphery, susceptor 110 includes an annular step 156 having a generally horizontal surface 158 and a generally vertical surface 160. Wafer carrier 100 is mounted on susceptor 110 so that the inner diameter of annular ring 150 mates with vertical surface 160 to prevent relative movement between wafer carrier 100 and susceptor 110 in a lateral direction. In this assembled position, the free end 152 of annular ring 150 is spaced from horizontal surface 158 so that a gap 161 is formed therebetween. This gap assures that, when wafer carrier 100 is mounted on susceptor 110, the bottom surfaces 144 of depending members 142 will contact the upper surface 162 of the susceptor. This may be accomplished by making the thickness T of annular ring 150 less than the total of the thickness t of one depending member 142 and the height h of vertical surface 160. This relationship would thus result in the formation of void spaces 166 inwardly of annular ring 150 and between the upper surface 162 of susceptor 110 and the lower surface 132 of wafer carrier 100 in the regions 133 in which it is spaced from upper surface 162. As a result of the vacuum conditions under which the deposition process is carried out, these void spaces 166 ordinarily will become filled with the reactant gases used in the process.

The configuration of wafer carrier 100 described above, and its relationship to susceptor 110, enables a substantially uniform temperature to be developed across the surface of wafers 140 mounted therein. More particularly, it will be appreciated that heat transfer from one body to another may occur through thermal conductance, thermal radiation or convection. In the temperature range in which epitaxial deposition is typically conducted (i.e., about 500–800° C.), heat transfer by conductance plays a prominent role in comparison to heat transfer by radiation or convection.

Furthermore, the thermal conductivity of solids is much greater than the thermal conductivity of gases. For example, hydrogen, which is a typical carrier gas used in epitaxial deposition processes, has a thermal conductivity of 0.098 W/mC, while graphite, a typical material for forming wafer carriers, has a thermal conductivity of about 97 W/mC.

In the assembled position described above, wafer carrier 100 is in direct contact with the upper surface 162 of susceptor 110 in those regions substantially underlying pockets 134, and is spaced from the upper surface 162 of susceptor 110 in those regions which do not substantially underlie pockets 134. In this arrangement, the heat from susceptor 110 is transferred to the portions of upper surface 130 forming pockets 134 by thermal conductance through the material of wafer carrier 100, and to the remaining portions of upper surface 130 first by thermal conductance through the reactant gases within spaces 166, and then by thermal conductance through the wafer carrier material between lower surface 132 in regions 133 and upper surface 130. Since heat transfer by thermal conductance during epitaxial deposition is more prominent than heat transfer by either radiation or convection, and since the thermal conductivity of the solid material forming wafer carrier 100 is much greater than the thermal conductivity of the reactant gases, the portions of wafer carrier 100 contacting susceptor 110, i.e., those portions substantially underlying pockets 134, will be heated more than those regions of wafer carrier 100 which do not contact susceptor 110, i.e., those portions which do not substantially underlie pockets 134. In other words, spaces 166 between susceptor 110 and wafer carrier 100 produce an insulating effect such that the insulated portions of wafer carrier 100 do not become as heated as the noninsulated portions. As a result, the surface temperature of pockets 134 in wafer carrier 100 will be higher than the temperature of the upper surface 130 of the wafer carrier between pockets 134. Because of the thermal resistance between each wafer 140 and the surface of the pocket 134 surrounding it, and because of the different emissivities of wafers 140 and wafer carrier 100, wafers 140 will be at a somewhat lower temperature than the temperature of pockets 134. Thus, by selecting appropriate dimensions for a wafer carrier having the configuration of wafer carrier 100, wafers 140 can be heated to a temperature which is approximately the same as the temperature of upper surface 130 of wafer carrier 100 between pockets 134.

Figure 17:
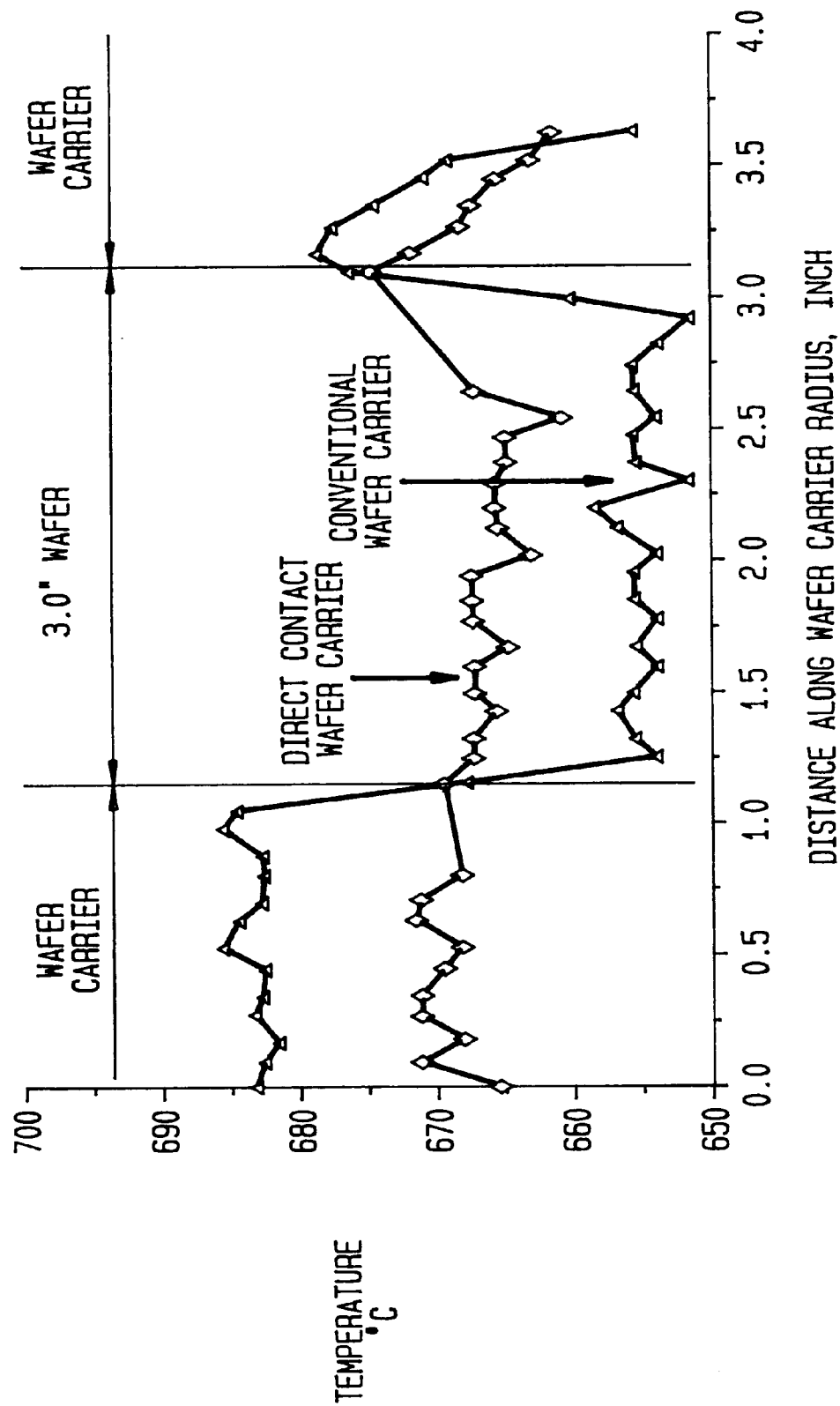
FIG. 17 is a graphical representation showing the improved temperature uniformity across the surface of the wafer carrier of FIG. 3a , with the wafer mounted therein, as opposed to conventional prior art wafer carriers.

This improved temperature uniformity is illustrated in FIG. 17, which shows that, with the wafer carrier of the present invention, the temperature across the surface of a 3.0 inch wafer is substantially the same as the temperature of the upper surface of the wafer carrier on either side of the wafer. In contrast, FIG. 17 illustrates that, for conventional wafer carriers, the temperature across the surface of the wafer is significantly less than the temperature of the upper surface of the wafer carrier on either side thereof.

Figure 4A:
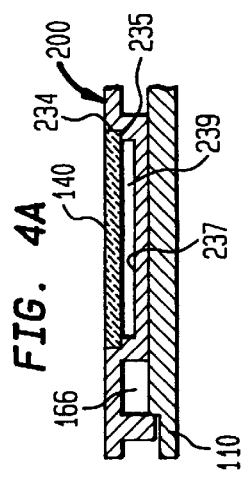
FIG. 4A is a highly schematic partial front cross-sectional view of a second embodiment of a wafer carrier of the present invention positioned on a susceptor and showing a wafer mounted therein.
Figure 4B:
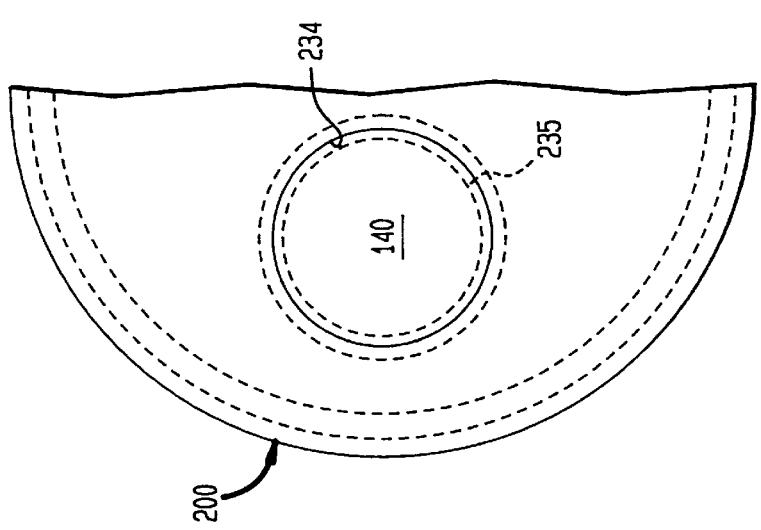
FIG. 4B is a partial top plan view of the wafer carrier shown n FIG. 4A.

An alternate embodiment of a wafer carrier in accordance with the present invention is illustrated as wafer carrier 200 in FIGS. 4A and B. Wafer carrier 200 differs from wafer carrier 100 described above only in the configuration of the wafer pockets therein. Thus, rather than the substantially flat bottom surface of pockets 134 in wafer carrier 100, pockets 234 in wafer carrier 200 have a depressed central portion so as to define an annular shoulder 235 along the circumference of the pocket. In this embodiment, each wafer 140 rests only upon an annular shoulder 235, therefore eliminating any potential hot spots in the central portion of the wafer caused by localized points of contact between the wafer and the bottom surface of the pocket on which it rests. Nonetheless, the heat transfer principles described above in connection with wafer carrier 100 are equally applicable. That is, although there is a gap 239 (typically between about 0.010 inches and about 0.015 inches) created between wafer 140 and the bottom surface 237 of pocket 234 such that wafer 140 is heated by a combination of thermal conductance through the wafer carrier material between susceptor 110 and bottom surface 237 and thermal conductance through the reactant gases in gap 239, the void spaces 166 between susceptor 110 and the portions of wafer carrier 200 which do not underlie pockets 234 have a much greater thickness than gaps 239 (on the order of about ten times the thickness of gaps 239), and therefore a significantly lower overall thermal conductance, such that the overall heat transfer between susceptor 110 and wafer carrier 200 will be greater in the regions underlying pockets 234 than it will be in the regions which do not underlie pockets 234. Although the overall heat transfer to wafers 140 will be less with wafer carrier 200 than with wafer carrier 100, such that a greater temperature gradient will be developed between wafers 140 and the upper surface of the wafer carrier between the wafers, greater temperature uniformity across the majority of the central portion of the wafers' surfaces will be achieved with wafer carrier 200 in that it eliminates any hot spots that may be caused by areas of point contact between wafers 140 and the bottom surface 237 of pockets 234. It therefore will be appreciated that, while wafer carriers 100 and 200 both reduce the temperature gradient between the surface of the wafers and the upper surface of the wafer carrier, wafer carrier 200 would be preferable to wafer carrier 100 where the temperature uniformity across wafers 140 is of primary concern, but would be less preferable than wafer carrier 100 where the primary concern is the reduction of the temperature gradient between wafers 140 and the upper surface of the wafer carrier.

Figure 5A:
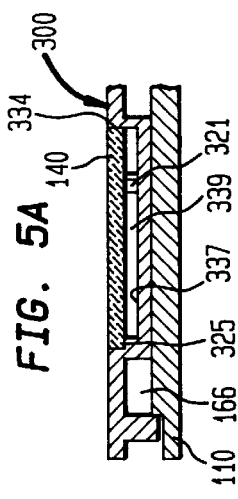
FIG. 5A is a highly schematic partial front cross-sectional view of a third embodiment of a wafer carrier of the present invention positioned on a susceptor and showing a wafer mounted therein.
Figure 5B:
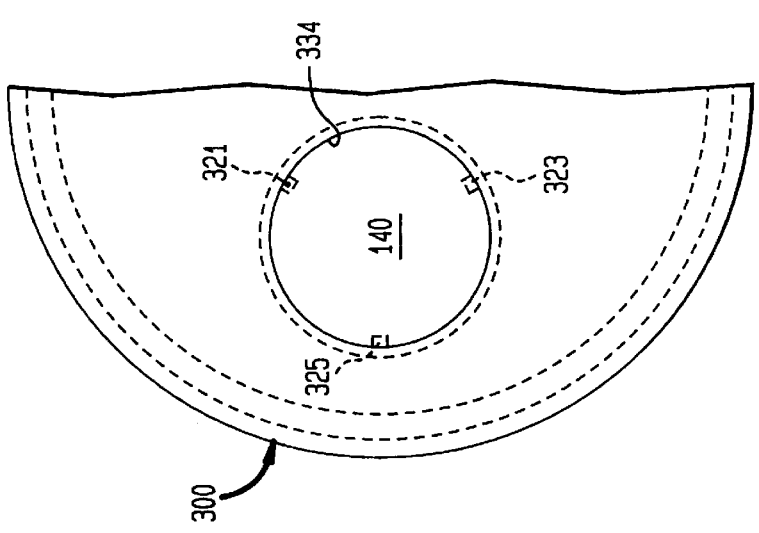
FIG. 5B is a partial top plan view of the wafer carrier shown FIG. 5A.

FIGS. 5A and B illustrate a variant of wafer carrier 200. Thus, rather than supporting wafers 140 on an annular shoulder as in wafer carrier 200, the illustrated wafer carrier 300 includes three segments of the annular shoulder forming supports 321, 323 and 325 for supporting wafers 140 by three point loading. This support mechanism minimizes the occurrence of any localized hot spots along the periphery of wafers 140 and thus increases the overall temperature uniformity across the surface of the wafers. Again, since the thickness of the gap 339 between wafers 140 and the bottom surface 337 of pockets 334 is much less than the thickness of the void spaces 166 in the regions which do not substantially underlie pockets 334, the pockets 334 and, hence, the wafers residing therein, are heated to a greater extent than the upper surfaces of wafer carrier 300 between the pockets. As with wafer carrier 200, however, since the overall heat transfer to wafers 140 will be less than that achieved with wafer carrier 100, wafer carrier 300 will exhibit a temperature gradient between wafers 140 and the upper surface of the wafer carrier between the wafers which is greater than that resulting from wafer carrier 100.

Figure 6A:
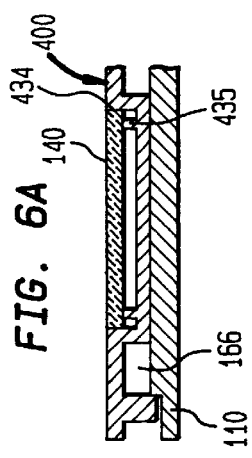
FIG. 6A is a highly schematic partial front cross-sectional view of a fourth embodiment of a wafer carrier of the present invention positioned on a susceptor and showing a wafer mounted therein.
Figure 6B:
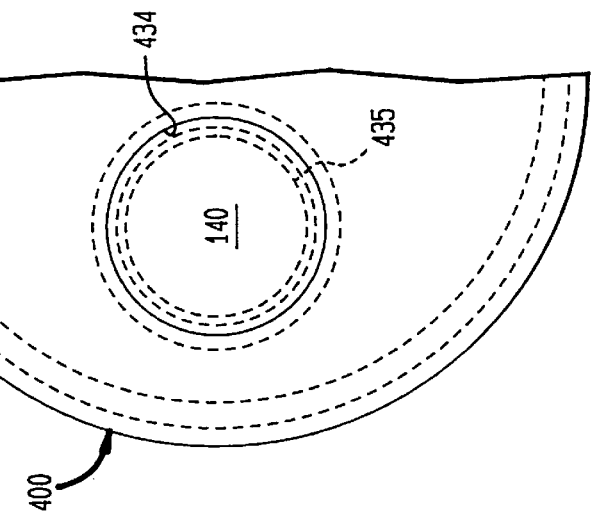
FIG. 6B is a partial top plan view of the wafer carrier shown in FIG. 6A.

Another variant of wafer carrier 200 is shown in FIGS. 6A and B. Wafer carrier 400 in accordance with this variant is similar to wafer carrier 200, with the exception that the annular shoulder 435 for supporting wafer 140 does not lie along the outer periphery of wafer pocket 434, but rather is spaced a short distance inwardly therefrom. This variant minimizes the potential for overheating the peripheral edge of wafer 140 which exists with the use of wafer carrier 200. Thus, with wafer carrier 200, excess heat transferred to the wafer by thermal conductance through annular shoulder 235 can be dissipated only inwardly from a position aligned with the inner edge of the annular shoulder. In contrast, with wafer carrier 400, excess heat transferred to wafer 140 through annular shoulder 435 can be dissipated both inwardly from a position aligned with the inner edge of the annular shoulder and outwardly from a position aligned with the outer edge of the annular shoulder. Hence, while the use of wafer carrier 400 may result in a wafer temperature in the region above annular shoulder 435 which is greater than the temperature along the remainder of the wafer, this temperature gradient will be less than that resulting from the use of wafer carrier 200.

Yet another variant of wafer carrier 200 is illustrated in FIGS. 7A and B. The wafer carrier 500 in accordance with this variant is substantially the same as wafer carrier 300 shown in FIGS. 5A and B, with the exception that supports 521, 523 and 525 are positioned at a spaced distance inwardly from the outer periphery of wafer pocket 534. As with wafer carrier 400, moving supports 521, 523 and 525 inwardly from the outer periphery of pocket 534 minimizes the temperature gradient across wafer 140 caused by thermal conductance through the supports by providing for heat dissipation through the wafer not only inwardly and laterally of the supports, but also outwardly therefrom.

A still further variant of wafer carrier 200 is illustrated in FIGS. 8A and B. Rather than having a substantially flat bottom surface as in wafer carrier 100, each wafer pocket 634 in wafer carrier 600 in accordance with this variant has a bottom surface 537 which is curved concavely upward. As a result of this configuration, each wafer 140 is supported only by a line of contact along its lower peripheral edge, thereby minimizing the higher temperature region along the periphery of the wafer caused by annular shoulder 235 and increasing the overall temperature uniformity across the wafer's surface.

Another embodiment of a wafer carrier 700 in accordance with the present invention is shown in FIGS. 9A and 9B. Wafer carrier 700 differs from wafer carrier 100 described above in that the thickness t of depending members 742 is less than the thickness of depending members 142, such that the bottom surfaces 744 of depending members 742 are not in surface contact with the upper surface 162 of susceptor 110 when wafer carrier 700 is in assembled position thereon. Rather, bottom surfaces 744 are spaced from the upper surface 162 of susceptor 110 so as to create a gap 745 therebetween. Gap 745 preferably has a thickness of between about 0.010 inches and about 0.015 inches. The presence of this gap eliminates any potential hot spots in wafer pockets 734 caused by localized points of contact between the bottom surfaces 744 thereof and the upper surface 162 of susceptor 110. Since the bottom surfaces 744 of depending members 742 do not rest in surface contact on the upper surface of susceptor 110, the annular ring 750 of wafer carrier 700 preferably has a greater thickness T than the annular ring 150 of wafer carrier 100 so that annular ring 750 rests upon the annular step 756 formed in the periphery of the susceptor to support wafer carrier 700 in an assembled position thereon. In this arrangement, however, the heat transfer mechanisms are similar to those described above in connection with wafer carrier 200. Thus, each wafer 140 is heated by a combination of thermal conductance through the reactant gases in gap 745 and thermal conductance through the wafer carrier material between the bottom surface 744 of depending member 742 and wafer 140. Further, the void spaces 166 between susceptor 110 and the portions of wafer carrier 700 which do not underlie pockets 734 have a much greater thickness than gaps 745, and therefore a significantly lower overall thermal conductance. Accordingly, the overall heat transfer between susceptor 110 and wafer carrier 700 is greater in the regions underlying pockets 734 than it is in the regions which do not underlie pockets 734. While the overall heat transfer to wafers 140 will be relatively low with wafer carrier 700 in comparison to that of wafer carrier 100, and a greater temperature gradient therefore will be developed between wafers 140 and the upper surface of the wafer carrier between the wafers, wafer carrier 700 will achieve a greater temperature uniformity across the surface of wafers 140 since it eliminates any hot spots in wafer pockets 734 that may be caused by areas of point contact between the bottom surfaces 744 of depending members 742 and the top surface 162 of susceptor 110. Therefore, as with wafer carrier 200, wafer carrier 700 would be preferable to wafer carrier 100 where high temperature uniformity across wafers 140 is the primary concern, but would be less preferable than wafer carrier 100 where the primary concern is to minimize the temperature gradient between wafers 140 and the upper surface of the wafer carrier between the wafers.

Figure 11A:
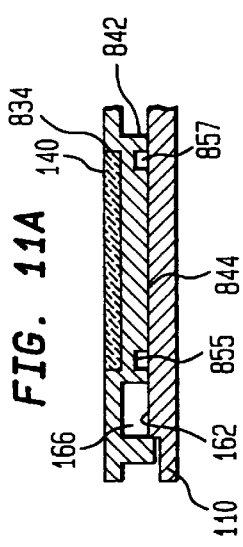
FIG. 11A is a highly schematic partial front cross-sectional view of a ninth embodiment of a wafer carrier of the present invention positioned on a susceptor and showing a wafer mounted therein.
Figure 11B:
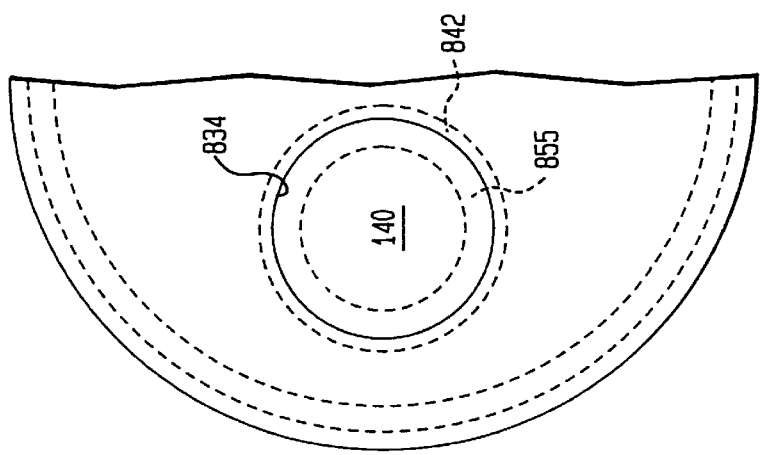
FIG. 11B is a partial top plan view of the wafer carrier shown in FIG. 11A.
Figure 10A:
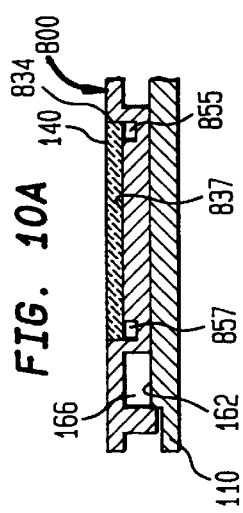
FIG. 10A is a highly schematic partial front cross-sectional view of an eighth embodiment of a wafer carrier of the present invention positioned on a susceptor and showing a wafer mounted therein.
Figure 10B:
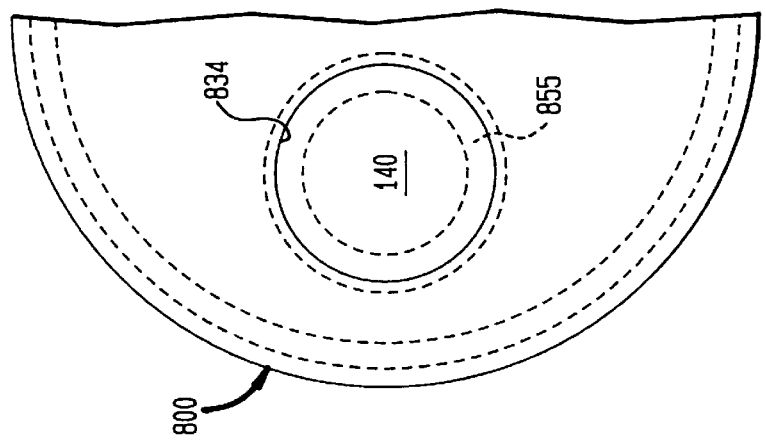
FIG. 10B is a partial top plan view of the wafer carrier shown in FIG. 10A.

Yet a further embodiment of a wafer carrier 800 in accordance with the present invention is shown in FIGS. 10A and 10B. In accordance with this embodiment, the bottom surface 837 of wafer pockets 834 includes an annular groove 855 along the periphery thereof. It will be appreciated that this configuration reduces the overall heat transfer to the periphery of wafers 140 by creating an annular void space 857 therebelow, wherein heat transfer to this portion of the wafers will include thermal conductance through the reactant gases in void spaces 857. This configuration is particularly useful in those situations in which thermal conductance from both the bottom and side surfaces of the wafer pockets tends to heat the outer periphery of the wafer to a higher temperature than the central portion thereof. A variant of this embodiment is illustrated in FIGS. 11A and 11B, wherein the annular groove 855 is formed in the bottom surface 844 of depending members 842 in substantial vertical alignment with the outer periphery of wafer 140. In this configuration, heat transfer to the outer periphery of wafer 140 will include thermal conductance through the reactant gases in the void spaces 857 formed between the bottom of the wafer carrier and the upper surface 162 of susceptor 110, thus reducing the overall heat transfer to the wafer's periphery.

Figure 12A:
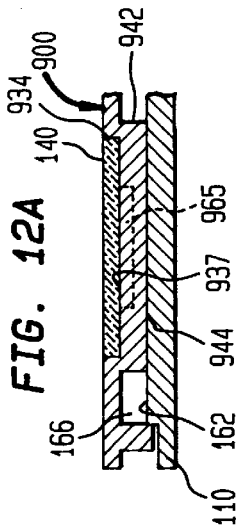
FIG. 12A is a highly schematic partial front cross-sectional view of a tenth embodiment of a wafer carrier of the present invention positioned on a susceptor and showing a wafer mounted therein.
Figure 12B:
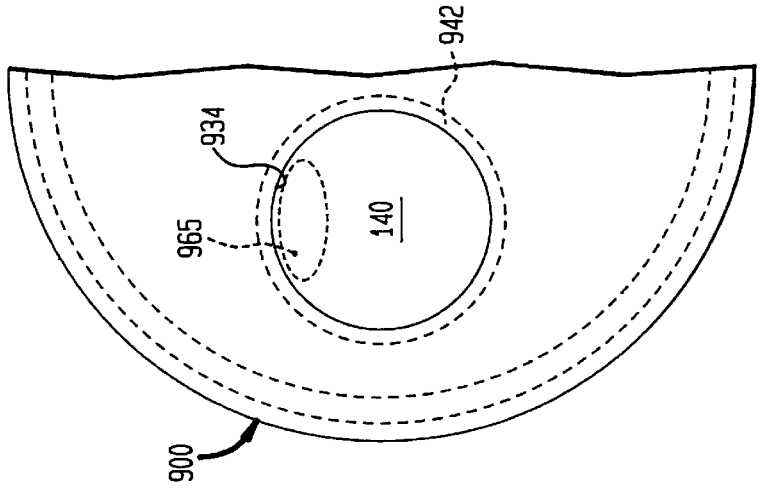
FIG. 12B is a partial top plan view of the wafer carrier shown in FIG. 12A.

Still a further embodiment of a wafer carrier 900 in accordance with the present invention is shown in FIGS. 12A and 12B. Wafer carrier 900 is intended to compensate for those processes in which rotation of the wafer carrier and susceptor assembly causes a temperature gradient to develop between the leading edge of the wafer carrier and the trailing edge thereof. The wafer carrier 900 illustrated in FIGS. 12A and 12B is intended to compensate for those wafer carriers in which rotation of the wafer carrier/susceptor assembly in the clockwise direction of FIG. 12B causes the leading edge of wafer pocket 934 to be heated to a greater extent than its trailing edge. Thus, in accordance with this embodiment, depending member 942 may include a void space 965 positioned generally in its leading edge and extending downwardly from the bottom surface 937 of wafer pocket 934 for the purpose of decreasing the overall heat transfer to the portion of wafer 140 overlying void space 965. Void space 965 may be formed with an elliptical configuration as shown in FIG. 12B, or with another shape particularly tailored to compensate for the temperature profile of that portion of wafer 140 which ordinarily becomes overheated. Moreover, the thickness of void space 965 need not be constant over its entire area, but may be selected so as to correspond to the temperature gradient which ordinarily develops in the wafers. That is, void space 965 may be configured to be thickest in those regions below the portion of the wafer which ordinarily becomes hottest, and thinner in those regions below the portions of the wafer which are hotter than the trailing edge but less hot than the hottest regions. Although not shown, it will also be appreciated that void space 965 may extend upwardly from the bottom surface 944 of depending member 942 rather than downwardly from the bottom surface 937 of wafer pocket 934. In addition, void space 965 may extend all the way through depending member 942 from its bottom surface 944 to the bottom surface 937 of wafer pocket 934.

Figure 13A:
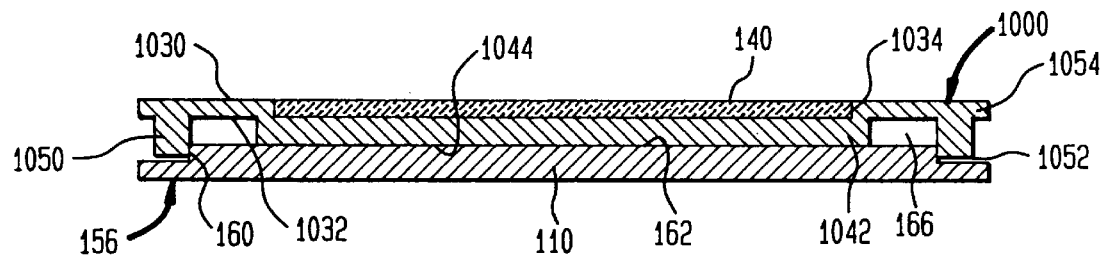
FIG. 13A is a highly schematic front cross-sectional view of an eleventh embodiment of a wafer carrier of the present invention for use with single wafers, showing a wafer mounted therein and the susceptor on which the wafer carrier is mounted.
Figure 13B:
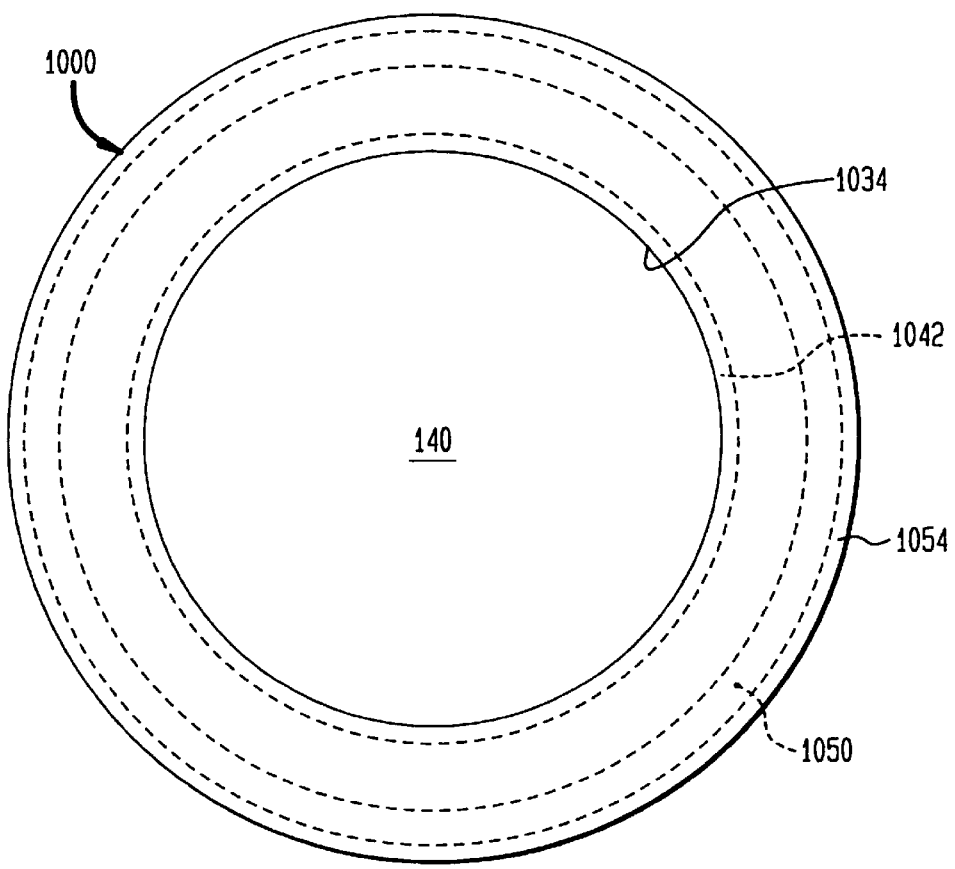
FIG. 13B is a top plan view of the wafer carrier shown in FIG. 13A.

The principles of the present invention may also be applied to wafer carriers used for processing only a single wafer at a time. A wafer carrier 1000 in accordance with this embodiment of the present invention is shown in FIGS. 13A and 13B. Wafer carrier 1000 has substantially the same configuration as wafer carrier 100 described above. That is, wafer carrier 1000 has a generally disc-shaped body with an upper surface 1030 extending generally in a plane, a wafer pocket 1034 formed centrally therein for holding a wafer 140, and a lower surface 1032 extending generally parallel to upper surface 1030 such that wafer carrier 1000 has a substantially uniform thickness in those regions which do not substantially underlie pocket 1034. In the region of wafer carrier 1000 substantially underlying pocket 1034, and generally concentric therewith, lower surface 1032 projects away from upper surface 1030 to define a depending member 1042 having a bottom surface 1044 which is spaced from the remainder of lower surface 1032. Depending member 1042 preferably has a thickness of between about 0.10 inches and about 0.15 inches between bottom surface 1044 and lower surface 1032 in the regions which do not substantially underlie pocket 1034. Additionally, depending member 1042 preferably has a diameter of between about 0.8–1.2 times the diameter of pocket 1034, and most preferably a diameter which is about equal to the diameter of pocket 1034.

As with each of the wafer carriers described above, wafer carrier 1000 may include an annular ring 1050 projecting away from upper surface 1030 and terminating in a free end 1052, annular ring 1050 preferably being spaced from the outer periphery of upper surface 1030 so as to define an annular flange 1054 coextensive with upper surface 1030 for maneuvering wafer carrier 1000 into and out of a reaction chamber. Annular ring 1050 is sized to mate with the vertical surface 160 of annular step 156 on susceptor 110 to hold wafer carrier 1000 in assembled relationship therewith. In this assembled position, bottom surface 1044 of depending member 1042 rests on the upper surface 162 of susceptor 110, thus defining void spaces 166 inwardly of annular ring 1050 and between the upper surface 162 of susceptor 110 and the portions of lower surface 1032 of wafer carrier 1000 which are spaced from upper surface 162. The free end 1052 of annular ring 1050 preferably is spaced from susceptor 110 in this assembled position to assure that bottom surface 1044 contacts the upper surface 162 of the susceptor. As described more fully above in connection with wafer carrier 100, void spaces 166 produce an insulating effect such that the heat transfer through the portions of wafer carrier 1000 underlying wafer pocket 1034 is greater than the heat transfer through the portions of wafer carrier 1000 which do not underlie wafer pocket 1034. As a result, wafer pocket 1034 will be heated to a higher temperature than the upper surface 1030 of the wafer carrier surrounding wafer pocket 1034 such that, by selecting appropriate dimensions for wafer carrier 1000, wafer 140 mounted therein can be heated to approximately the same temperature as these surrounding upper surface portions of the wafer carrier. Although not reiterated in detail at this point, the various modifications to the wafer carrier to improve the temperature uniformity across the surface of the wafer, as described above in connection with wafer carriers 200–900 for simultaneously processing a plurality of wafers, are equally applicable to wafer carriers, such as wafer carrier 1000, used to process a single wafer at a time.

In those processes in which the wafer carrier is rotated to improve processing uniformity, the rotation typically is achieved by mounting the susceptor at its center to a rotatable spindle. This spindle ordinarily is not itself heated, and thus acts as a heat sink which draws heat away from the center of the susceptor. This is generally not a problem where a plurality of wafers are processed simultaneously using a single wafer carrier, since these wafer carriers ordinarily include a plurality of wafer pockets arranged symmetrically around the center thereof such that no one wafer pocket overlies the axial center of the susceptor where the spindle is connected. Hence, the fact that the spindle may draw some heat away from the center portion of the susceptor does not interfere with the temperature of the wafers positioned in the wafer pockets. It will therefore be appreciated that each of the wafer carrier embodiments described above for processing a plurality of wafers simultaneously may be mounted for rotation on a spindle, even though the use of a spindle has not been described previously in connection with each embodiment.

In contrast, in those situations where a wafer carrier for processing a single wafer is mounted to a rotating susceptor, the presence of the spindle may have an effect on the temperature of the wafers. In those processes, the wafer carrier ordinarily is mounted on the susceptor such that a central region of the wafer pocket therein overlies that portion of the susceptor connected to the rotating spindle. As the spindle draws heat away from the region of the susceptor adjacent to where it is connected, the temperature gradient created in the susceptor is transferred to the overlying wafer pocket such that there is a non-uniform temperature distribution across the surface of the wafer being processed.

One embodiment of the present invention for addressing this particular problem is illustrated in FIG. 14. The wafer carrier 1100 in accordance with this embodiment is similar to wafer carrier 1000 described above, differing only in the configuration of the wafer pocket 1134 therein. Rather than having a substantially flat bottom surface as does wafer pocket 1034 in wafer carrier 1000, pocket 1134 in wafer carrier 1100 may be contoured to define an annular channel 1155 curved concavely upward, with a portion 1157 of maximum thickness in the central region of pocket 1134 substantially overlying spindle 99. The contour of wafer carrier 1100 may be such that a wafer 140 positioned thereon will be supported in its center by the substantially flat surface of portion 1157, and along its lower peripheral edge by a line of contact along the periphery of pocket 1134. Intermediate these portions, a gap 1139 will be created between wafer 140 and the bottom surface 1167 of channel 1155. Thus, the central region of wafer 140 would be heated by thermal conductance through the relatively cool wafer carrier material in portion 1157, such that the resultant temperature in the central region of the wafer would be less than that which would be achieved if the susceptor were not mounted on a spindle. The remainder of wafer 140 would be heated by a combination of thermal conductance through the relatively hotter wafer carrier material between susceptor 110 and the bottom surface 1167 of channel 1155 and thermal conductance through the reactant gases in gap 1139. This combination of thermal conductances would result in a wafer temperature which is less than that which would be achieved by heating through the wafer carrier material alone. Hence, with a gap 1139 of an appropriate thickness, a substantially uniform temperature distribution across the surface of wafer 140 can be achieved with the use of a wafer carrier having a configuration of wafer carrier 1100.

In addition to the configuration of wafer pocket 1134 described above, wafer carrier 1100 defines void spaces 166 in those regions which do not underlie wafer pocket 1134. Since the thickness of void spaces 166 is much greater than the thickness of gap 1139, the overall heat transfer between susceptor 110 and wafer carrier 1100 will be significantly greater in the region underlying pocket 1134 than it will be in the regions which do not underlie pocket 1134, with the result being that the temperature across the surface of wafer 140 will be substantially similar to the temperature across the upper surface of the wafer carrier surrounding the wafer.

Another embodiment of the present invention for use with spindle-mounted susceptors is shown as wafer carrier 1200 in FIG. 15. Wafer carrier 1200 differs from wafer carrier 1000 described above in that depending member 1242 has a thickness which is less than the thickness of depending member 1042, such that when wafer carrier 1200 is assembled on susceptor 110, a gap 1245 is created between the upper surface 162 of the susceptor and the bottom surface 1244 of the depending member 1242. Furthermore, the bottom surface 1244 of depending member 1242 may have a curved profile, and preferably a spherically curved profile, so that the thickness of gap 1245 varies from a minimum thickness in the region overlying the center of susceptor 110 to a maximum thickness at the outer periphery of depending member 1242. It will be understood that heat transfer from susceptor 110 to wafer 140 will occur through a combination of thermal conductance through the reactant gases in gap 1245 and thermal conductance through the wafer carrier material between the bottom surface 1244 of depending member 1242 and wafer 140. The overall thermal conductance therefore will be the greatest in the center of wafer pocket 1234 where depending member 1242 is thickest and gap 1245 is thinnest, which area corresponds to the central region of susceptor 110 which is at the lowest temperature by reason of the heat loss through spindle 99. On the other hand, the overall thermal conductance will be the lowest at the periphery of wafer pocket 1234 where depending member 1242 is thinnest and gap 1245 is thickest, which area corresponds to a region of susceptor 110 which is warmer than the central region. Assuming the temperature of susceptor 110 increases gradually between the central region thereof to the region underlying the outer periphery of depending member 1242, this gradual increase in temperature may be compensated for by a corresponding gradual decrease in the overall thermal conductance therefrom so that the overall heat transfer to wafer 140 would be substantially the same across the entire surface of the wafer, thereby producing improved temperature uniformity thereacross. As an alternative to having a smoothly curved profile, the bottom surface 1244 of depending member 1242 may include a multiplicity of steps such that depending member 1242 is thickest and gap 1245 is thinnest in the region overlying the center of susceptor 110.

Again, wafer carrier 1200 defines void spaces 166 in those regions which do not underlie wafer pocket 1234. Since the thickness of void spaces 166 is much greater than the maximum thickness of gap 1245, the overall heat transfer between susceptor 110 and wafer carrier 1200 will be greater in the region underlying pocket 1234 than it will be in the regions which do not underlie pocket 1234. Accordingly, the temperature across the surface of wafer 140 mounted in wafer carrier 1200 will be substantially equal to the temperature across the upper surface of the wafer carrier surrounding the wafer.

The lower temperature in the central region of susceptor 110 resulting from the heat loss through spindle 99 need not be compensated for by altering the configuration of the wafer carrier used therewith. As an alternative technique, the heat loss can be compensated for by altering the configuration of the susceptor itself. One embodiment of an altered susceptor 111 and a wafer carrier 1300 for use therewith is shown in FIG. 16. Susceptor 111 is similar to susceptor 110 described above, but includes an upwardly projecting region 113 of increased thickness in the central region thereof where susceptor 111 is connected to spindle 99.

Wafer carrier 1300 has a generally ring-shaped configuration with an upper surface 1330 and a lower surface 1332. Upper surface 1330 extends generally in a plane and includes a pocket 1334 sized to receive a wafer 140. Wafer carrier 1300 differs from all of the wafer carriers described above in that pocket 1334 does not include a bottom surface. Rather, pocket 1334 includes a generally cylindrical bore 1310 which extends entirely through wafer carrier 1300 and which includes a circumferential shoulder 1335 for supporting wafer 140 along the peripheral edge thereof. On its lower surface 1332, wafer carrier 1300 may include an annular ring 1350 projecting away from upper surface 1330 and terminating in a free end 1352. A second annular ring 1360 projects away from upper surface 1330 at a spaced distance from annular ring 1350, terminating in a free end 1362. Annular ring 1360 defines circumferential shoulder 1335 in bore 1310, and preferably has an outer diameter of between about 0.8–1.2 times the diameter of the upper portion of wafer pocket 1334, and most preferably a diameter which is about equal to the diameter of the upper portion of pocket 1334.

In the assembled position of wafer carrier 1300 on susceptor 111, the free end 1362 of annular ring 1360 rests upon the upper surface 163 of susceptor 111. In this assembled position, the inner diameter of annular ring 1350 mates with the vertical surface 161 of an annular step 117 formed around the periphery of susceptor 111 so as to prevent lateral movement between the wafer carrier and susceptor. The free end 1352 of annular ring 1350 in this assembled position is spaced from the horizontal surface 119 of annular step 117 so that a gap 121 is formed therebetween. As described previously, this gap assures that, when wafer carrier 1300 is mounted on susceptor 111, the free end of annular ring 1360 will contact the upper surface 163 of the susceptor. This relationship thus results in the formation of void spaces 166 between the upper surface 163 of the susceptor and the regions of lower surface 1332 of wafer carrier 1300 which lie between annular rings 1350 and 1360. With a wafer positioned on wafer carrier 1300, a second void space 171 is defined between wafer 140 and the upper surface 163 of susceptor 111.

It will be appreciated from the discussions above that, while void spaces 166 and 171 ordinarily will become filled with reactant gases during the use of wafer carrier 1300 to process wafers 140, the presence of the void spaces has an overall insulating effect on the transfer of heat from the susceptor to the wafer carrier and the wafer mounted thereon. Also, as the thickness of the void spaces increases, their overall insulating effect will be increased. Bearing these principles in mind, it will be seen from FIG. 16 that the thermal conductance from susceptor 111 to wafer 140 will be greater in the central region of the wafer overlying upwardly projecting region 113 of the susceptor than in the portions of the wafer overlying the remainder of the susceptor. However, since the temperature of susceptor 111 in region 113 is less than the temperature in the remainder of the susceptor by virtue of the heat loss through spindle 99, the overall heat transfer to the central portion of wafer 140 will be substantially the same as the overall heat transfer to the remainder of the wafer. Forming region 113 of susceptor 111 with ramped sidewalls 102 and 104 accounts for the fact that there is a gradual increase in temperature from region 113 to the remainder of the susceptor rather than a sudden temperature change.

The concept of changing the contour of the susceptor to produce greater heat transfer from the susceptor to the wafer pockets than from the susceptor to the portions of the wafer carrier surrounding the wafer pockets, as illustrated in FIG. 16, can be applied to the numerous embodiments of the wafer carrier described previously. Rather than having a depending member project from below each wafer pocket toward the susceptor to increase the mass of solid material therebetween and thus increase thermal conductance, wafer carriers may be formed with substantially planar lower surfaces, and the susceptor may be formed with one or more disc-shaped members projecting upwardly toward the wafer carrier, one disc-shaped member for each wafer pocket. Such arrangement would require a mechanism, such as a conventional keying system, for assuring that the wafer carrier and the susceptor are in proper rotational alignment so that each of the wafer pockets is properly positioned over an upwardly projecting member on the susceptor's surface. These discshaped members would have the same effect of increasing the solid mass underlying the wafer pocket so as to increase the thermal conductance from the susceptor thereto. Since the remaining portions of the susceptor would be spaced farther from the lower surface of the wafer carrier, the thermal conductance to the portions of the wafer carrier overlying these portions of the susceptor would be significantly less. The result would be an arrangement in which the temperature across the wafer surface would be substantially similar to the temperature of the upper surface of the wafer carrier between the wafers.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and the scope of the present invention as set forth in the appended claims.

We claim:

1. An apparatus for supporting a substrate in a coating deposition chamber, comprising
    a substrate holder having an upper surface and a lower surface, said upper surface defining a cavity for receiving said substrate, and said lower surface having a first portion disposed at a relatively low elevation in regions substantially underlying said cavity and a second portion at a higher elevation in regions defining a continuous surface circumscribing said first portion.

2. The apparatus as claimed in claim 1, wherein said cavity has a diameter and said lower surface includes a substantially cylindrical member in said regions substantially underlying said cavity, said substantially cylindrical member having a diameter of between about 0.8–1.2 times said diameter of said cavity.

3. The apparatus as claimed in claim 2, wherein said diameter of said substantially cylindrical member is about equal to said diameter of said cavity.

4. The apparatus as claimed in claim 1, wherein said cavity includes a bottom surface and support means for supporting said substrate at a spaced distance from said bottom surface.

5. The apparatus as claimed in claim 4, wherein said support means comprises an annular shoulder.

6. The apparatus as claimed in claim 4, wherein said support means comprises at least three spaced elements projecting upwardly from said bottom surface for supporting said substrate by three-point loading.

7. The apparatus as claimed in claim 4, wherein said bottom surface is curved in an upwardly concave direction.

8. The apparatus as claimed in claim 4, wherein said bottom surface includes an annular groove formed along the periphery of said cavity.

9. The apparatus as claimed in claim 1, wherein said lower surface includes a substantially cylindrical mass of material in said first portion, said substantially cylindrical mass of material including a void space disposed asymmetrically with respect to an axis of said substantially cylindrical mass of material.

10. The apparatus as claimed in claim 1, wherein said upper surface defines a plurality of cavities, said lower surface having first portions disposed at a relatively low elevation in regions substantially underlying each one of said plurality of cavities and having second portions at a higher elevation in regions defining continuous surfaces circumscribing said first portions .

11. An apparatus for supporting a substrate in a coating deposition chamber, comprising
    a heated body having a mounting surface; and
    a substrate holder mounted on said mounting surface of said heated body in an assembled position, said substrate holder having an upper surface and a lower surface, said upper surface defining a cavity for receiving said substrate, said lower surface in said assembled position being disposed closer to said heated body in a predetermined region substantially underlying said cavity than in at least some regions not underlying said cavity, said at least some regions including surrounding portions defining a continuous surface circumscribing said predetermined region, whereby there is greater thermal conductivity between said heated body and said substrate holder in said predetermined region than in said surrounding portions.

12. The apparatus as claimed in claim 11, wherein said upper surface defines a plurality of cavities, said lower surface in said assembled position being disposed closer to said heated body in regions substantially underlying each one of said plurality of cavities than in at least some regions not underlying any one of said plurality of cavities.

13. The apparatus as claimed in claim 11, wherein said lower surface in said predetermined region contacts said mounting surface of said heated body in said assembled position.

14. The apparatus as claimed in claim 11, wherein said lower surface in said predetermined region is spaced from said mounting surface of said heated body in said assembled position.

15. The apparatus as claimed in claim 11, wherein said cavity has a diameter and said lower surface includes a substantially cylindrical member in said predetermined region, said substantially cylindrical member having a diameter of between about 0.8–1.2 times said diameter of said cavity.

16. The apparatus as claimed in claim 15, wherein said diameter of said substantially cylindrical member is about equal to said diameter of said cavity.

17. The apparatus as claimed in claim 11, wherein said cavity includes a bottom surface and support means for supporting said substrate at a spaced distance from said bottom surface.

18. The apparatus as claimed in claim 17, wherein said bottom surface is curved in an upwardly concave direction.

19. The apparatus as claimed in claim 11, wherein, in said assembled position, said lower surface is spaced from said mounting surface of said heated body by a first distance in a central portion of said predetermined region, and said lower surface is spaced from said mounting surface of said heated body by a second distance greater than said first distance in peripheral portions of said predetermined region.

20. The apparatus as claimed in claim 11, wherein said substrate holder has a greater mass of solid material in said predetermined region than in said at least some regions not underlying said cavity.

21. The apparatus as claimed in claim 11, wherein said heated body has a greater mass of solid material in said predetermined region than in said at least some regions not underlying said cavity.

22. The apparatus as claimed in claim 11, wherein said cavity has diameter for receiving said substrate and said lower surface includes a substantially cylindrical member in said predetermined region, said substantially cylindrical member having a diameter of between about 0.8–1.2 times said diameter of said cavity.

23. The apparatus as claimed in claim 22, wherein said diameter of said substantially cylindrical member is about equal to said diameter of said cavity.

24. The apparatus as claimed in claim 11, wherein said cavity includes a bottom surface and support means for supporting said substrate at a spaced distance from said bottom surface.

25. The apparatus as claimed in claim 11, wherein said substrate holder includes a predetermined mass of material in said predetermined region, said mass of material having a greater thickness in areas underlying a center of said cavity than in areas not underlying said center of said cavity.

* * * * *